(12) United States Patent
Dunn et al.

(10) Patent No.: US 7,361,847 B2
(45) Date of Patent: Apr. 22, 2008

(54) CAPACITANCE LAMINATE AND PRINTED CIRCUIT BOARD APPARATUS AND METHOD

(75) Inventors: Gregory J. Dunn, Arlington Heights, IL (US); Jaroslaw A. Magera, Palatine, IL (US); Jovica Savic, Downers Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/323,515

(22) Filed: Dec. 30, 2005

(65) Prior Publication Data

US 2007/0151758 A1  Jul. 5, 2007

(51) Int. Cl.
 *H05K 1/16* (2006.01)
(52) U.S. Cl. ...................... 174/260; 174/262
(58) Field of Classification Search ............ 174/260, 174/262; 361/792, 793, 794
 See application file for complete search history.

(56) References Cited

U.S. PATENT DOCUMENTS

| | | | |
|---|---|---|---|
| 5,010,641 A * | 4/1991 | Sisler .................... 29/830 |
| 5,161,086 A * | 11/1992 | Howard et al. .......... 361/321.1 |
| 6,215,649 B1* | 4/2001 | Appelt et al. .............. 361/312 |
| 6,541,137 B1 | 4/2003 | Kingon et al. |
| 6,872,468 B1 | 3/2005 | Dean et al. |
| 6,884,655 B2* | 4/2005 | Iijima et al. ............... 438/107 |
| 6,910,266 B2* | 6/2005 | Lee et al. ..................... 29/832 |
| 2003/0063453 A1* | 4/2003 | Kusagaya et al. .......... 361/794 |
| 2005/0108874 A1* | 5/2005 | Lee et al. ..................... 29/849 |
| 2005/0128720 A1 | 6/2005 | Croswell et al. |
| 2005/0135074 A1 | 6/2005 | Dunn et al. |
| 2005/0242997 A1 | 11/2005 | Dunn et al. |

\* cited by examiner

*Primary Examiner*—Ishwar (I. B.) Patel

(57) ABSTRACT

A method is for fabricating an embedded capacitance printed circuit board assembly (400, 1100). The embedded capacitance printed circuit board assembly includes two embedded capacitance structures (110). Each capacitance structure (110) includes a crystallized dielectric oxide layer (115) sandwiched between an outer electrode layer (120) and an inner electrode layer (125) in which the two inner electrode layers are electrically connected together. A rivet via (1315) and a stacked via (1110) formed from a button via (910) and a stacked blind via (1111) may be used to electrically connect the two inner electrode layers together. A spindle via (525) may be formed through the inner and outer layers. The multi-layer printed circuit board may be formed from a capacitive laminate (100) that includes two capacitance structures.

2 Claims, 9 Drawing Sheets

CAPACITANCE LAMINATE AND PRINTED CIRCUIT BOARD APPARATUS AND METHOD

RELATED APPLICATIONS

This application is related to U.S. patent applications having Ser. No. 11/084,934, entitled "Printed Circuit Patterned Embedded Capacitance Layer", filed on Mar. 21, 2005, and Ser. No. 11/139,056, entitled "Peelable Circuit Board Foil", filed on May 27, 2005.

FIELD OF THE INVENTION

The present invention relates generally to multi-layer printed circuit board fabrication, and more specifically to multi-layer printed circuit boards that include an embedded capacitive layer.

BACKGROUND

For electronic equipment, small volume is a desirable attribute. Logic circuits have achieved small volume by being embodied in integrated circuits. However, achieving small volume for lumped elements such as resistors, capacitors, and inductors has proved more difficult, particularly for capacitors and inductors used at lower frequencies and higher currents. For many applications, capacitors of high capacitance values, such as those used for power supply and bypass filtering or low frequency coupling, are provided in the form of surface mounted packages.

More recently, a variety of techniques for fabricating a very thin crystallized dielectric oxide layer useful for embedding within a multi-layer circuit board have been publicized. These techniques provide capacitive densities far exceeding previous methods. Methods of providing connections to and through these layers have been developed, but further improvement in this aspect is desirable, to lower direct costs and improve yields.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate the embodiments and explain various principles and advantages, in accordance with the present invention.

Figure 1:
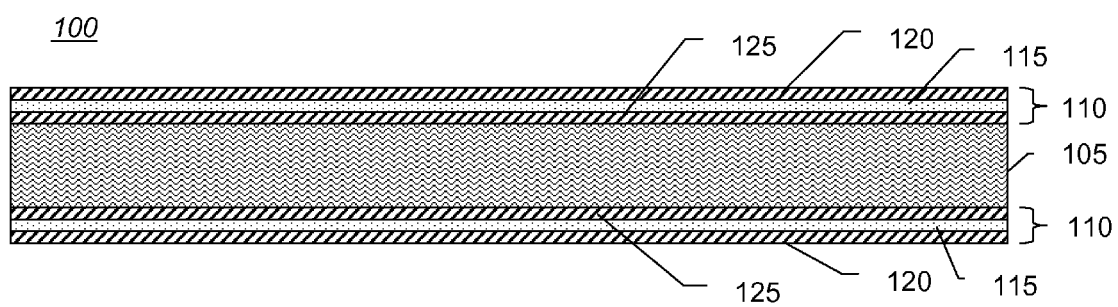
FIGS. 1-14 are cross sectional views of a multi-layer printed circuit board sub-assembly in various stages of assembly, in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to multi-layer printed circuit boards. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Embodiments of a unique multi-layer printed circuit board having two embedded capacitance structures are described herein that are uniquely compatible with multi-layer printed circuit board fabrication technologies currently in widespread use.

Referring to FIG. 1, a cross sectional diagram of a printed circuit board sub-assembly 100 that comprises a polymer dielectric layer 105 sandwiched between two capacitance structures 110 is shown, in accordance with some embodiments of the present invention. Each of the two capacitance structures 110 comprises a crystallized dielectric oxide layer 115 sandwiched between an outer electrode layer 120 and an inner electrode layer 125. The polymer dielectric layer 105 is typically an epoxy or glass filled epoxy such as the printed circuit board material designated FR4, and is typically within a thickness range of 40-150 microns. The crystallized dielectric layer 115 may comprise any of a variety of dielectric oxides, such as lead zirconate titanate (PZT), lead lanthanide zirconate titanate (PLZT), lead calcium zirconate titanate (PCZT), lead lanthanide titanate (PLT), lead titanate (PT), lead zirconate (PZ), lead magnesium niobate (PMN), barium titanate (BTO) or barium strontium titanate (BSTO). The crystallized dielectric layer 115 may have a thickness from about 0.1 to about 2 microns, and in many circumstances may be from about 0.2 microns to about 0.6 microns thick, and may provide capacitances greater than 1000 picoFarad per square millimeter (1000 $pF/mm^2$). The term "sandwiched" as used herein means that a first layer is disposed between a second and third layer, the second and third layers formed of the same material. Other layers may be disposed between the first layer and the second layer and/or the first layer and the third layer, but the other layers do not accumulatively have a thickness that is a significant percentage of the combined thickness of the second and third layers, wherein significant indicates more than 20 percent in this context.

The inner and outer electrode layers are made of an electrically conductive metal, typically copper, that has a thickness that is typically within a range from 5 to 25 microns thick. Benefits of the present invention may result with electrode and polymer dielectric layers even larger or smaller than those cited above, and the electrode material may be of other metals or alloys.

In some embodiments, the printed circuit board sub-assembly 100 at the stage shown in FIG. 1 has been fabricated with the polymer dielectric layer 105 being a glass-filled polymer that is at least 15 microns thick but less than 100 microns thick, and typically less than 60 microns thick. In this form, the printed circuit board sub-assembly 100 is a unique double capacitive laminate that is structurally robust enough to be fabricated at one facility and shipped to another for fabrication of a completed multi-layer printed circuit board, and yet thin enough for laser drilling of holes that are as small as approximately 60 microns in diameter, which can be used in combination with the unique via forming techniques to produce a very high surface density and very thin multi-layer printed circuit board assembly having very high value embedded capacitances, in comparison to conventional multi-layer printed circuit board assemblies.

Figure 2:
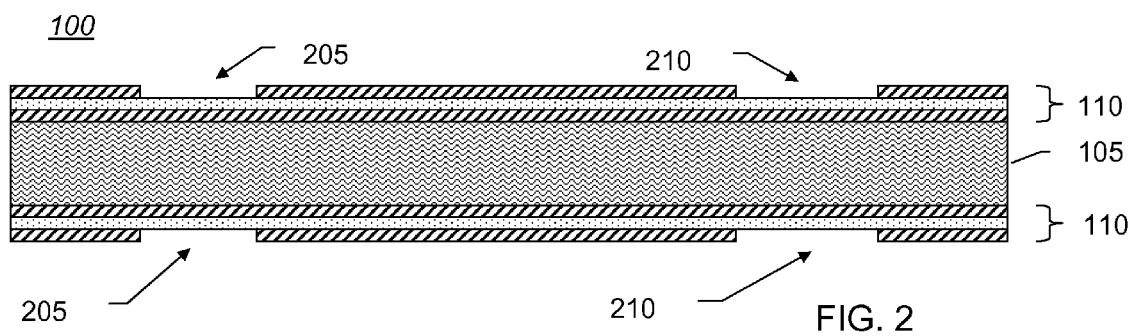

Referring to FIG. 2, a cross sectional diagram of the printed circuit board sub-assembly 100 is shown after a step of patterning has been completed. Conventional, widely accepted patterning techniques may be used, such as those based on lithography and etching. The step of patterning results in via clearances 205, 210 where material of the outer electrode layers 120 has been removed where a via is to be formed. The via clearance 205 may be in the form of a circular opening in the outer electrode layer that is in the range of 250-500 microns in diameter, and the via clearance 210 may be in the form of a circular opening in the outer electrode layer that is in the range of 500-750 microns in diameter.

Figure 3:
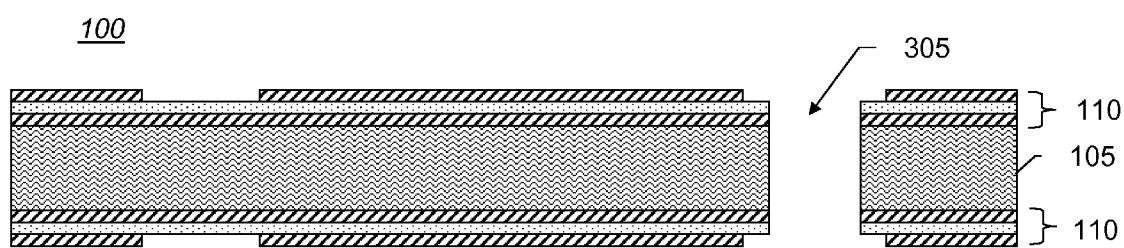

Referring to FIG. 3, a cross sectional diagram of the printed circuit board sub-assembly 100 is shown after a step of forming a first hole 305 in the via clearances 210 has been completed. The first hole 305 passes through the layers of the printed circuit board sub-assembly 100 that remain in the area of the via clearances 210. The first hole 305 may be formed by any one of a variety of methods, including those conventionally used such as ultraviolet light (UV) laser drilling and mechanical drilling. The first hole 305 may have a diameter in range of 400-600 microns.

Figure 4:
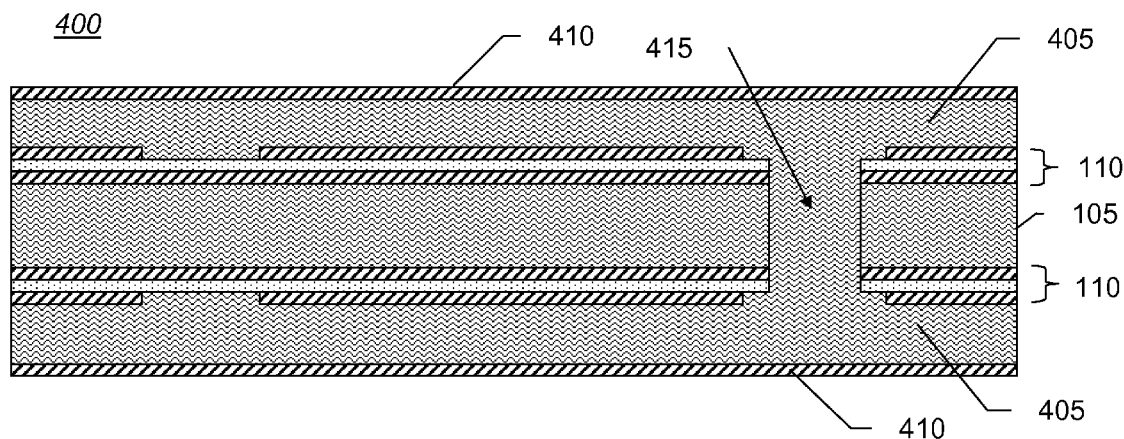

Referring to FIG. 4, a cross sectional diagram of a printed circuit board sub-assembly 400 is shown, in accordance with some embodiments of the present invention. The embedded capacitance printed circuit sub-assembly 400 is formed after a layer of polymer dielectric 405 and an outermost metal layer 410 is laminated to each side of the printed circuit board sub-assembly 100. The polymer dielectric layer 405 and outermost metal layer 410 may be a single unit such as resin-coated foil (RCF) or two separate elements such as a pre-preg layer (glass-reinforced B-stage polymer) and a metal foil. Other processes could be used. This lamination step results in polymer dielectric layers 405 that are typically within a range of 25-100 microns, and outermost metal layers 410 that are typically within a range of 5-40 microns.

For processes that do not inherently result in an adequate filling of the first hole 305 in the region 415 of the polymer dielectric layer 105, a process to adequately fill the first hole 305 with polymer material may be required before the lamination is started. Some processes, such as those using pre-preg and a metal foil, may adequately fill the hole. By adequately filling it is meant that the first hole 305 must be sufficiently filled so that a subsequent barrel plating step of a subsequently formed second hole (described below) provides reliable electrical continuity from one outermost metal layer 410 to the other outermost metal layer 410.

When the lamination process is completed, an embedded capacitance printed circuit board sub-assembly 400 having outermost metal layers has been fabricated.

Figure 5:
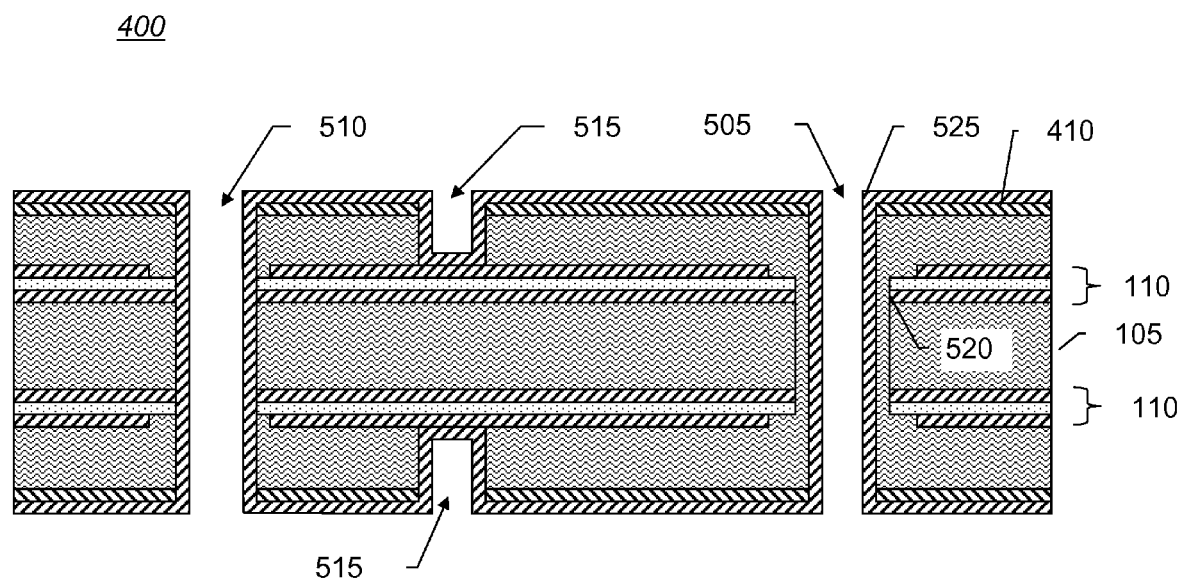

Referring to FIG. 5, a cross sectional diagram of the embedded capacitance printed circuit board sub-assembly 400 is shown, in accordance with some embodiments of the present invention. The embedded capacitance printed circuit board sub-assembly 400 is shown after hole forming and plating processes are completed. As a result of the hole forming process, a second hole 505 is formed within the perimeter of the first hole, through the embedded capacitance printed circuit board assembly 400. The second hole 505 is sufficiently small—typically in the range 125-250 microns—so that under all of the expected process variations enough polymer material remains between the barrel of the second hole and the edges of the barrel of the first hole 305, such as edges 520. During this process, other holes may be formed in the embedded capacitance printed circuit board sub-assembly 400, such as through hole 510 (typically 125-250 microns in diameter) and blind microvia holes 515 (typically 50-125 microns in diameter).

It will be appreciated that the holes reduce the portions of both inner and outer electrode layers that can be used to form a capacitive plate of a capacitor that is formed by the remaining material of the inner and outer electrode layers of one of the capacitance structures 110. Other patterns in one or the other of the inner and outer electrode layers, such as isolated copper circles or copper "runners" that connect nodes in one of the inner or outer electrode layers, can further reduce the remaining material, or capacitive plate portion, of the inner or outer electrode layer of one of the capacitance structures 110. Such reductions are typically a negligibly small fraction of the inner or outer electrode layer and cause correspondingly negligible reduction of the initial capacitance of each capacitance structure 110.

The second hole 505, the through-hole 510, and the blind microvia holes 515 may be formed using conventional processes, such as mechanical drilling or or UV or $CO_2$ laser drilling, or a combination thereof. Other processes could be used.

The barrel of the second hole 505 is plated after it is formed. Typically the barrels of other holes, such as holes 510, 515 are plated at substantially the same time. Conventional plating techniques may be used, such as electroplating, typically forming a metal plating that is in a range of 10-40 microns thick. In one embodiment a known plating technique may be used that substantially fills blind microvia 515 with metal. When the barrels of the holes are plated, a layer of plating may be added to the outermost layers at the same time. The plating of second hole 505 forms a unique plated-through hole that is termed a spindle via 525, that electrically connects the outermost metal layers (by means of the plated metal of the barrel), while the barrel of the spindle via (second hole) 505 remains electrically isolated from the capacitive plate portions of the inner and outer electrode layers of the two capacitance structures.

Figure 6:
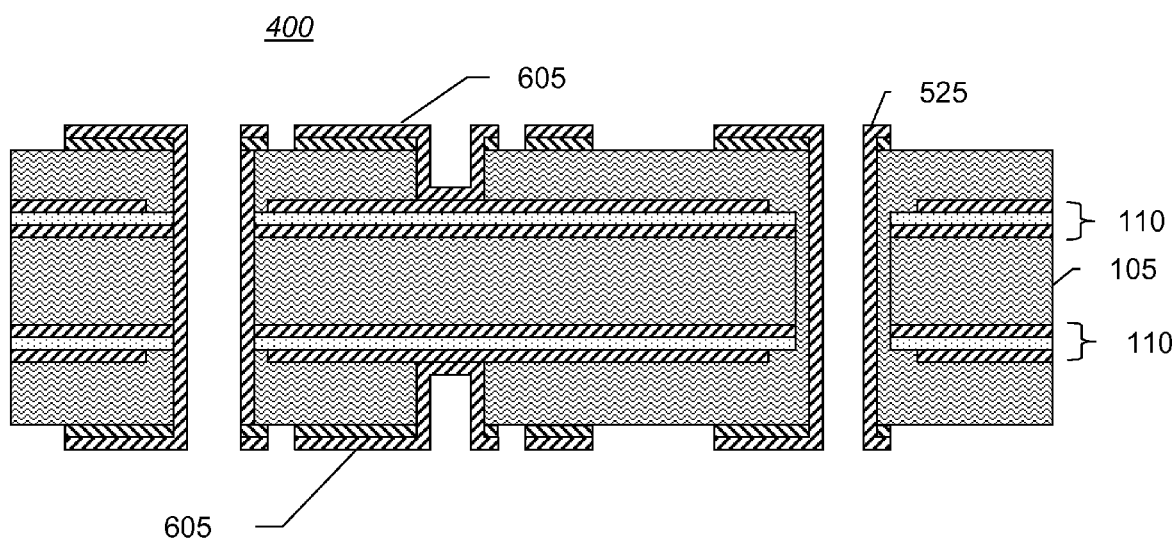

Referring to FIG. 6, a cross sectional diagram of the embedded capacitance printed circuit board sub-assembly 400 is shown, in accordance with some embodiments of the present invention. A conventional patterning process, such as that described above with reference to FIG. 2, is used to form nodes, runners, isolated capacitor outer plates, and other conventional conductive nodes on the outermost layers 410. For instance, the spindle via 525 is isolated from other portions of the outermost layers 410, and blind micro-vias 605 have been formed to electrically connect isolated capacitor outer plates of the capacitance structures 110 to the outermost surfaces of the embedded capacitance printed circuit board sub-assembly 400.

Figure 7:
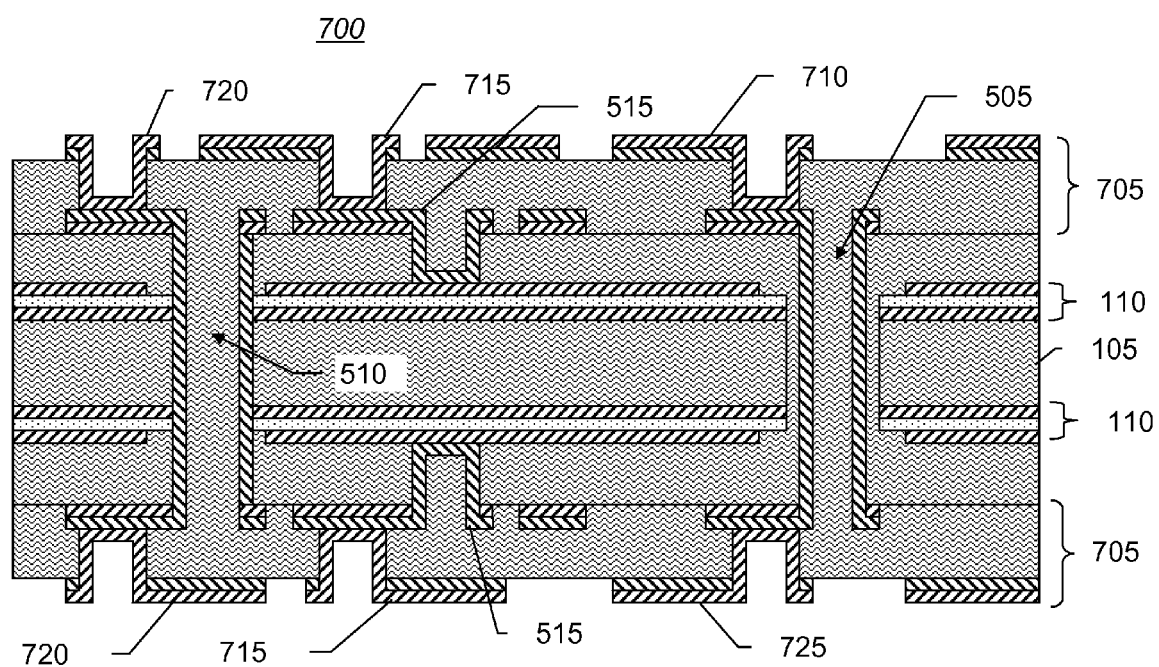

Referring to FIG. 7, a cross sectional diagram of a multi-layer embedded capacitance printed circuit board sub-assembly 700 is shown, in accordance with some embodiments of the present invention. An additional lamination and an additional patterning process adds a printed circuit board layer 705 to each side of the embedded capacitance printed circuit board sub-assembly 400, forming the multi-layer embedded capacitance printed circuit board sub-assembly 700, which may be complete but for the addition of surface parts to surface nodes 710, 715, 720, 725, or may be a sub-assembly to which more layers are added, in conventional fashion. In the example shown in FIG. 7, the through-hole via 510 couples the inner electrode layers of the two capacitance structures 110 to staggered surface micro vias 720, the blind micro-vias 515 couple the outer electrode layers of the two capacitance structures 110 to staggered surface micro vias 715, and the spindle via 505 couples a first surface micro via 710 to a second surface via 725.

It will be noted that in FIG. 7, conventional staggered vias are shown as being used to couple the inner electrode layers and outer electrode layers of the two capacitance structures 110 to the surface metal layers of the multi-layer embedded capacitance printed circuit board sub-assembly 700. This uses valuable area of the multi-layer embedded capacitance printed circuit board sub-assembly 700. The use of a mechanically-drilled through hole 510 to connect to the inner electrode layers of the capacitance structures 110 also uses valuable area, as mechanically-drilled holes are typically large (typically 250 microns in diameter, compared to typically 75-125 microns for a laser-drilled microvia). Unique techniques to reduce the amount of area required for coupling the inner and outer electrode layers of the two capacitance structures 110 are described below with reference to FIGS. 8-14.

Figure 8:
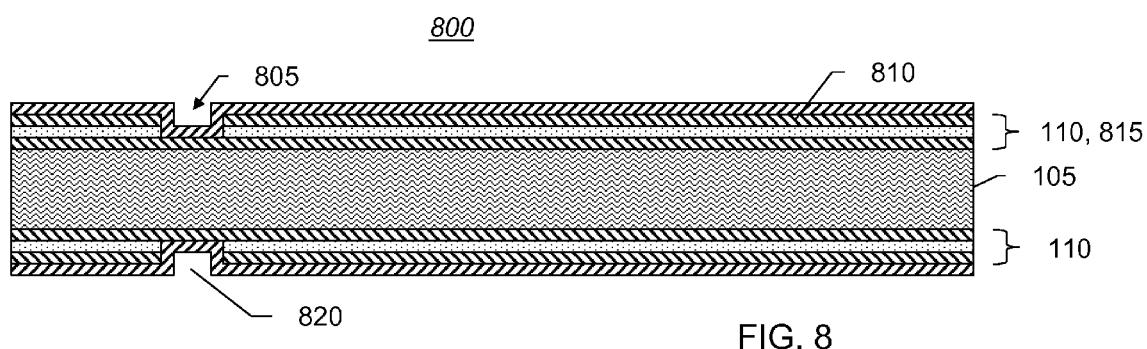

Referring to FIG. 8, a cross sectional diagram of a printed circuit board sub-assembly 800 is shown, in accordance with some embodiments of the present invention. The printed circuit board sub-assembly 800 may be formed from the same printed circuit board sub-assembly 100 as described with reference to FIG. 1. At the stage of fabrication illustrated by FIG. 8, a clearance 805 that may be as small as 50 microns in diameter has been patterned in the outer electrode layer 810 of a first capacitance structure 815 of the two capacitance structures 110, using conventional patterning techniques. New techniques may allow a smaller clearance 805. The thin layer of crystallized dielectric oxide has been removed at the bottom of the clearance, which is alternatively called clearance hole 805, or simply called hole 805, exposing a portion of the inner electrode layer of the first capacitance structure 815. The removal may be accomplished using a conventional technique, such as $CO_2$ laser ablation. Other techniques could be used, such as etching. The barrel of the hole 805 and the portion of the inner electrode layer of the first capacitance structure 815 has then been plated with a conductive metal, such as copper, using conventional techniques. This results in an electrical connection between the inner and outer electrode layers of the first capacitance structure 815. Of course, other holes similar to hole 805, such as hole 820, may be formed and plated by this stage using the same or similar processes.

Figure 9:
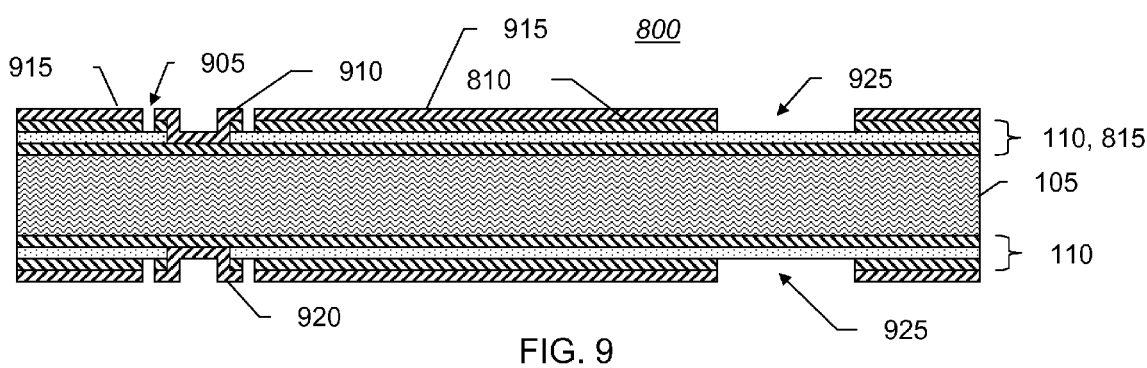

Referring to FIG. 9, a cross sectional diagram of the printed circuit board sub-assembly 800 is shown, in accordance with some embodiments of the present invention. The outer electrode layer 810, which has been plated, is then patterned to provide a clearance annulus 905 around the hole 805. Thus a via 910, named herein a button via, has been formed that is a node of the inner layer of the first capacitance structure 815. The button via 910 is electrically isolated from capacitive plate portions 915 of the outer electrode layer of the first capacitance structure 815. Furthermore, because of the thinness of the crystallized dielectric oxide layer (less than 2 microns), the plating at the bottom of the button via has a surface that is less than 10 microns below the surface of the plated outer electrode layer 810. This aspect may best be referred to as a depression of the button via that is less than 10 microns, an aspect that is uniquely exploited as described below. This aspect is, moreover, uniquely achieved without recourse to solid via plating technology, which is slower and therefore more costly than the conventional plating used here. Of course, other button vias, such as button via 920, may be formed and plated by this stage with button via 910, and other patterns may be formed, such as clearances 925, which have been formed for a spindle via.

Figure 10:
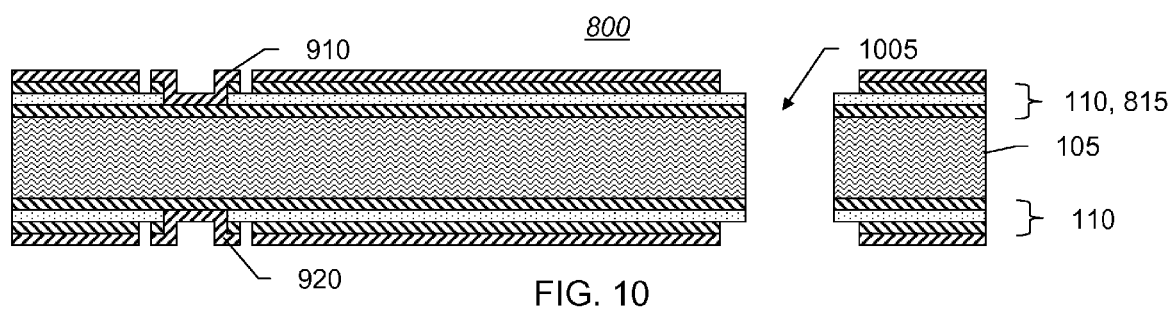

Referring to FIG. 10, a cross sectional diagram of the printed circuit board sub-assembly 800 is shown, in accordance with some embodiments of the present invention. At this stage, a clearance hole 1005 has been formed for the spindle via, in the same manner as described with reference to FIG. 3, first hole 305.

Figure 11:
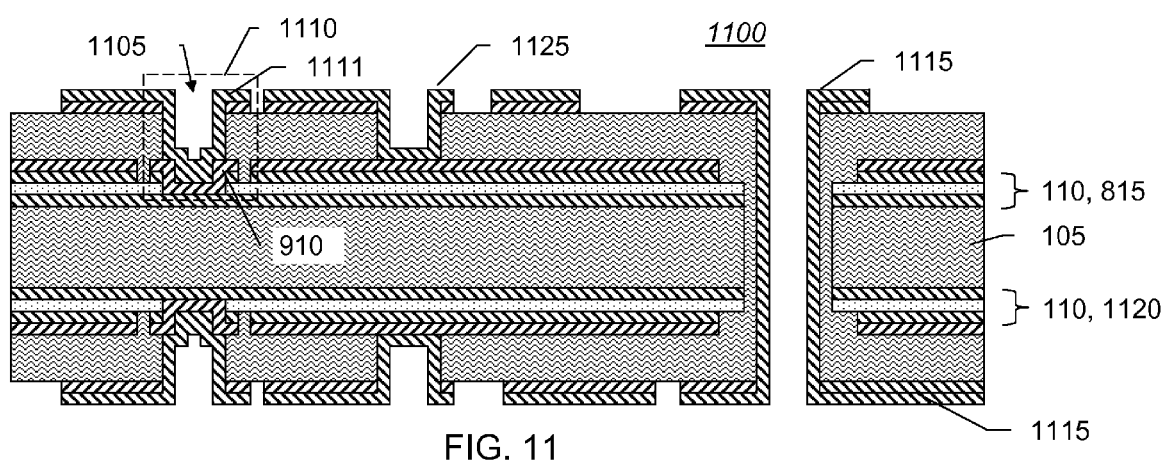

Referring to FIG. 11, a cross sectional diagram of an embedded capacitance printed circuit board sub-assembly 1100 is shown, in accordance with some embodiments of the present invention. At this stage, a layer of polymer dielectric and an outermost metal layer have been laminated to each side of the printed circuit board sub-assembly 800, as described above with reference to FIG. 4. Further, a hole 1105 that exposes a portion of the button via 910 has been formed through one of the outermost metal layers and the polymer dielectric, using conventional techniques, such as lithography and etching or UV or $CO_2$ laser ablation, or a combination of these. The barrel of the hole 1105 and the exposed portion of the button via are then plated, thereby forming a stacked via 1110 comprising the button via 910 and a stacked blind via 1111, wherein the stacked via 1110 electrically connects the inner electrode layer of the first capacitance structure 815 to the outermost metal layer of the embedded capacitance printed circuit board sub-assembly 1100, or any metal layer that is not a part of the two embedded capacitance structures. This stacked via is uniquely practical because the depression of the button via 910 is small, which permits reliable plating to the exposed surface of the button via 910. In contrast, conventional connections to conventionally plated inner layer vias use the staggered via approach, which takes up more lateral area of a multi-layer printed circuit board. It will be appreciated that the aspect that the stacked blind via 1111 may overlap (even completely) the button via is a unique aspect of these embodiments of the present invention. At this stage, the spindle via 1115 has been formed, as well as another stacked via for the second capacitance structure 1120, and standard blind micro-vias such as blind micro-via 1125

Figure 12:
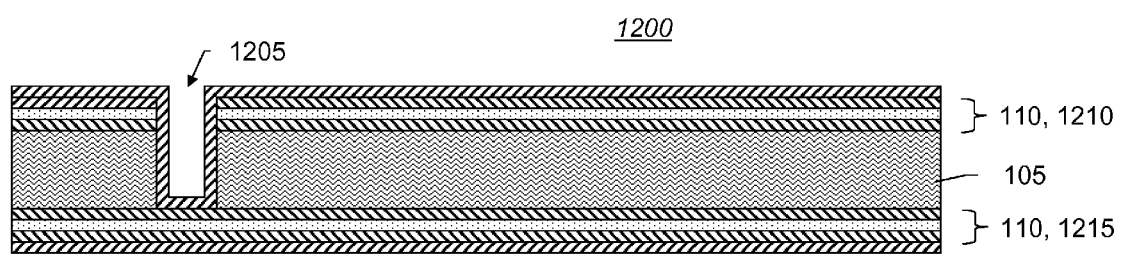

Referring to FIG. 12, a cross sectional diagram of a printed circuit board sub-assembly 1200 is shown, in accordance with some embodiments of the present invention. The printed circuit board sub-assembly 1200 may be formed from the same printed circuit board sub-assembly 100 as described with reference to FIG. 1. At the stage of fabrication illustrated by FIG. 12, a hole 1205 has been formed through a first capacitance structure 1210 of the two capacitance structures 110 and the polymer dielectric layer 105, down to (and perhaps slightly into) the surface of the second capacitive structure 1215, thereby exposing portions of the inner electrode layers of both of the two capacitance structures 110. The portions include an edge of the inner electrode of the first capacitance structure 1210 and the surface of the second capacitance structure 1215. The hole 1205 may be formed using UV or $CO_2$ laser ablation, or a combination of the two. For example, UV laser ablation may be used to cut through the first capacitance structure 1210, followed by a use of a $CO_2$ laser, which rapidly ablates polymer and glass materials but does not rapidly ablate metal, to cut through the polymer dielectric layer 105 and more precisely stop at the surface of the inner electrode layer of the second capacitive structure. The hole 1205 (barrel and bottom portions) are then plated, such as by electroplating. The plating thereby electrically connects the inner electrode layers of the two capacitance structures 110 to the outer electrode layer of the first capacitance structure 1210.

Figure 13:
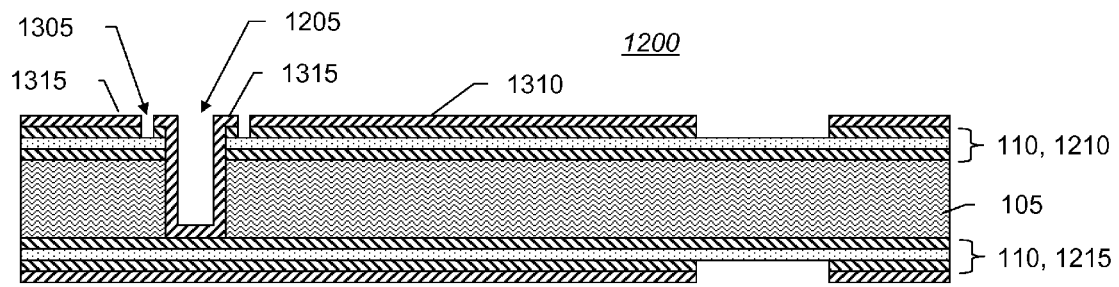

Referring to FIG. 13, a cross sectional diagram of the printed circuit board sub-assembly 1200 is shown, in accordance with some embodiments of the present invention. At the stage of fabrication illustrated by FIG. 13, a clearance annulus 1305 has been patterned around the hole 1205 in the outer electrode layer of the first capacitance structure 1210, using conventional patterning techniques, such as lithography and etching. A rivet via 1315 is thus formed that is a node of the coupled inner layers of the two capacitance structures 110. The node 1315 is electrically isolated from capacitive plate portions 1310 of the outer electrode layer of the first capacitance structure 1210.

Figure 14:
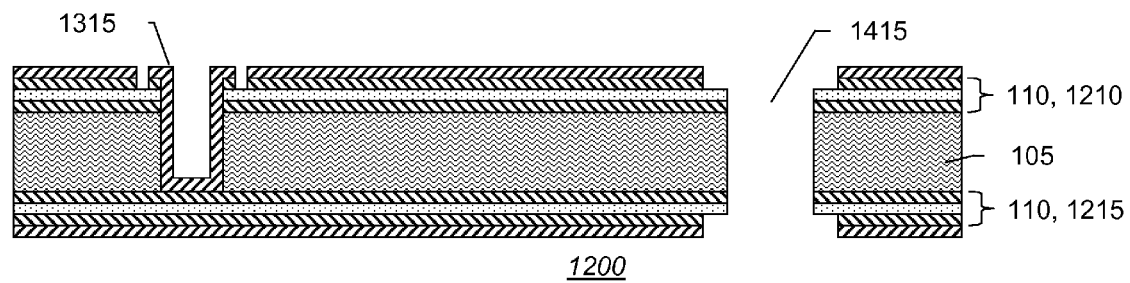

Referring to FIG. 14, a cross sectional diagram of the printed circuit board sub-assembly 1200 is shown, in accordance with some embodiments of the present invention. At the stage of fabrication illustrated by FIG. 14, a hole has been formed for a spindle hole such as described above with reference to FIG. 3, first hole 305, and FIG. 10, hole 1005. The printed circuit board sub-assembly 1200 may now be further processed in a manner described with reference to FIG. 11, resulting in an embedded capacitance printed circuit board sub-assembly similar to the embedded capacitance printed circuit board sub-assembly, but wherein the stacked via 1110 is replaced by the rivet via 1315 and a staggered blind via. Alternatively, if the rivet via is plated using solid via plating technology, a stacked blind via could be used.

The rivet via 1315 provides size reduction advantages over the plated through hole 510 illustrated in FIG. 5, for two reasons. First, it is formed by laser rather than mechanical drilling, and therefore may be smaller in diameter, for example 125 microns vs. 250 microns. Second, it electrically connects both inner layers of the capacitance structures 110 to the outermost metal layer on one side of the printed circuit board sub-assembly 1200 without encumbering space on the opposite outermost layer.

It will be appreciated that the printed circuit board sub-assemblies 100, 800, and 1200 may be different portions of one printed circuit board sub-assembly, or different portions of a four layer printed circuit board.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A multi-layer primed circuit board, comprising:
   two embedded capacitance structures, each comprising a crystallized dielectric oxide layer less than 2 microns thick sandwiched between an outer electrode layer and an inner electrode layer in which the two inner electrode layers are electrically connected together, further comprising a button via having a depression less than 10 micrometers deep that electrically connects the inner electrode layer of a first one of the two embedded capacitance structures to an isolated node of the outer electrode layer of the first one of the two embedded capacitance structures.

2. The multi-layer printed circuit board according to claim 1, further comprising a stacked blind via that overlaps the button via and electrically connects the inner electrode layer of the first one of the two embedded capacitance structures to a metal layer that is not a part of the two embedded capacitance structures.

* * * * *

UNITED STATES PATENT AND TRADEMARK OFFICE
CERTIFICATE OF CORRECTION

PATENT NO. : 7,361,847 B2  Page 1 of 1
APPLICATION NO. : 11/323515
DATED : April 22, 2008
INVENTOR(S) : Gregory J. Dunn et al.

It is certified that error appears in the above-identified patent and that said Letters Patent is hereby corrected as shown below:

IN THE SPECIFICATION

In Column 1, Line 8, delete "11,084,934," and insert -- 11/084,938, --, therefor.

IN THE CLAIMS

In Column 8, Line 27, in Claim 1, delete "primed" and insert -- printed --, therefor.

Signed and Sealed this

Thirtieth Day of June, 2009

JOHN DOLL
*Acting Director of the United States Patent and Trademark Office*